United States Patent [19]

Saika et al.

[11] Patent Number: 5,138,467
[45] Date of Patent: Aug. 11, 1992

[54] PHOTOELECTRIC CONVERSION DEVICE

[75] Inventors: Toshihiro Saika, Zama; Noriyuki Kaifu, Yokohama; Tadao Endo, Atsugi; Isao Kobayashi, Sagamihara; Tetsuya Shimada, Zama, all of Japan

[73] Assignee: Canon Kabushiki Kaisha, Tokyo, Japan

[21] Appl. No.: 486,211

[22] Filed: Feb. 28, 1990

[30] Foreign Application Priority Data

Feb. 28, 1989 [JP] Japan ................................. 1-45146

[51] Int. Cl.⁵ ............................................. H04M 1/04
[52] U.S. Cl. .................................................. 358/482
[58] Field of Search .................... 358/482, 488, 471; 250/578

[56] References Cited

U.S. PATENT DOCUMENTS

| | | | |
|---|---|---|---|
| 4,691,114 | 9/1987 | Hasegawa et al. | 358/482 |
| 4,827,345 | 5/1989 | Nakagawa et al. | 358/213.27 |
| 4,939,592 | 7/1990 | Saika et al. | 358/482 |

FOREIGN PATENT DOCUMENTS 0168030  1/1986  European Pat. Off. ............ 358/483

Primary Examiner—Edward L. Coles, Sr.
Attorney, Agent, or Firm—Fitzpatrick, Cella, Harper & Scinto

[57] ABSTRACT

A photoelectric conversion device comprises a plurality of blocks each having a plurality of sensor elements each consisting of a combination of a photoelectric conversion section, a charge storage section connected to the photoelectric conversion section, and a switch section arranged in a path for reading a charge from said charge storage section. Gate lines for operating a plurality of switch sections in a given block are commonly connected. Read lines from said switch sections are commonly connected in units of sensor elements corresponding to each block to constitute a wiring matrix. The gate lines are arranged between the adjacent common read lines of the wiring matrix.

17 Claims, 6 Drawing Sheets

PHOTOELECTRIC CONVERSION DEVICE

BACKGROUND OF THE INVENTION:

1. Field of the Invention

The present invention relates to a photoelectric conversion device and, more particularly, to a photoelectric conversion device in which common read lines are connected in a matrix.

2. Related Background Art

A conventional photoelectric conversion device used in an image reading apparatus such as a facsimile machine comprises a plurality of blocks each including a plurality of sensor elements each including a combination of a photoelectric conversion section, a charge storage section connected to the photoelectric conversion section, and a switch section arranged in a path for reading out a charge from the charge storage section. That is, since a photoelectric conversion device of this type has small photoelectric conversion sections linearly arranged at a high density, the sensor elements are grouped into blocks and wired in a matrix in units of blocks by using common read lines connected to the switch section.

FIG. 1 is a block diagram showing a basic arrangement of a conventional photoelectric conversion device of the type described above.

Referring to FIG. 1, a sensor section consists of blocks 2-1 to 2-n. Each block contains m sensor elements each consisting of a combination of a photoelectric conversion section, a charge storage section, and a switch section. A total number of bits of this photoelectric conversion device is n×m. A power source 4 applies a common voltage to the photoelectric conversion sections of all the blocks. A drive circuit 1 sequentially drives all the blocks. Wiring lines 6 connect the drive circuit 1 to the switch sections of the blocks. A read circuit 3 extracts a common output from the photoelectric conversion sections corresponding to each block. Wiring lines 5 connect the switch sections of the blocks to the read circuit 3. Shield wiring lines 7 are connected between the wiring lines 5 and are grounded.

FIG. 2 is a circuit diagram showing one of the blocks described above.

Referring to FIG. 2, each block includes photoelectric conversion sections 13, charge storage sections 14, reset switch sections 15, and transfer switch sections 16. A combination of the photoelectric conversion section 13, the charge storage section 14, the reset switch section 15, and the transfer switch section 16 constitutes one sensor element. In this case, each block consists of sensor elements 11-1 to 11-m.

FIG. 3 is a wiring pattern diagram showing a detailed arrangement of the photoelectric conversion device. In this case, each block consists of two sensor elements, and the photoelectric conversion device consists of two blocks. For illustrative convenience, FIG. 3 shows only upper and lower wiring patterns and contact holes.

More specifically, a block 11 consists of sensor elements 11-1 and 11-2, and a block 12 adjacent to the block 11 consists of sensor elements 12-1 and 12-2. The elements represented by reference numerals 13, 14, 15, and 16 are defined as described with reference to FIG. 2.

A wiring line 21 connects a power source 4 to one electrode of each of the photoelectric conversion sections 13 of all the blocks. A wiring line 22 connects the power source 4 to one electrode of each of the charge storage sections of all the blocks and is grounded. A discharge wiring line 23 is connected to the reset switch sections 15 of all the blocks.

The gate lines of the transfer switch sections 16 of the two sensor elements 11-1 and 11-2 in the block 11 are commonly connected to a wiring line 31. The gate lines of the reset switch sections 15 of the two sensor elements 11-1 and 11-2 are commonly connected to a wiring line 32. Similarly, the gate lines of the transfer switch sections 16 of the two sensor elements 12-1 and 12-2 in the block 12 are commonly connected to the wiring line 32. The gate lines of the reset switch sections 15 of the two sensor elements 12-1 and 12-2 are commonly connected to a wiring line 33.

The read line from the transfer switch section 16 of the sensor element 11-1 in the block 11 and the read line from the transfer switch section 16 of the sensor element 12-1 in the block 12 are commonly connected to a wiring line 34. Similarly, the read line from the transfer switch section 16 of the sensor element 11-2 in the block 11 and the read line from the transfer switch section 16 of the sensor element 12-2 in the block 12 are commonly connected to a wiring line 35, thereby forming a wiring matrix.

Shield wiring lines 36, 37, and 38 are grounded. The shield wiring lines 36, 37, and 38 have a function of eliminating capacitive coupling of the common read wiring lines 34 and 35 and preventing crosstalk of the read signals.

Since the conventional photoelectric conversion device described above, however, has the shield wiring lines, the width (i.e., a width in the vertical direction in FIG. 3) of a wiring section including the common gate wiring lines, the common read wiring lines, and the shield wiring lines is increased. Assume that an A4 sized original is read at a resolution of 8 lines/mm, that the number of bits per block is 42, and that the photoelectric conversion device has 42 blocks. Under these assumptions, the wiring section must consist of 42 common read lines, 43 shield wiring lines, and 43 common gate wiring lines. When these wiring lines are formed by a 10-μm line and space rule, a total width becomes 2,570 μm, and the photoelectric conversion device becomes a large scale one. Since a number of photoelectric conversion device chips available from a substrate is greatly reduced, greater producing cost would be incurred. In addition, since a large number of wiring lines are formed, manufacturing yield is decreased.

SUMMARY OF THE INVENTION:

It is an object of the present invention to solve the conventional problems described above and to provide a compact, low-cost and high performance photoelectric conversion device wherein the width of a wiring section can be reduced, and a production yield can be increased.

In order to achieve the above object of the present invention, there is provided a photoelectric conversion device comprising a plurality of blocks each having a plurality of sensor elements each consisting of a combination of a photoelectric conversion section, a charge storage section connected to the photoelectric conversion section, and a switch section arranged in a path for reading a charge from the charge storage section, wherein gate lines for operating a plurality of switch sections in a given block are commonly connected, and read lines from the switch sections are commonly connected in units of sensor elements corresponding to each block to constitute a wiring matrix, and the gate lines are arranged between the adjacent common read lines of the wiring matrix.

DETAILED DESCRIPTION OF THE PREFERRED EMBODIMENT:

A preferred embodiment of the present invention will be described with reference to the accompanying drawings.

Figure 1:
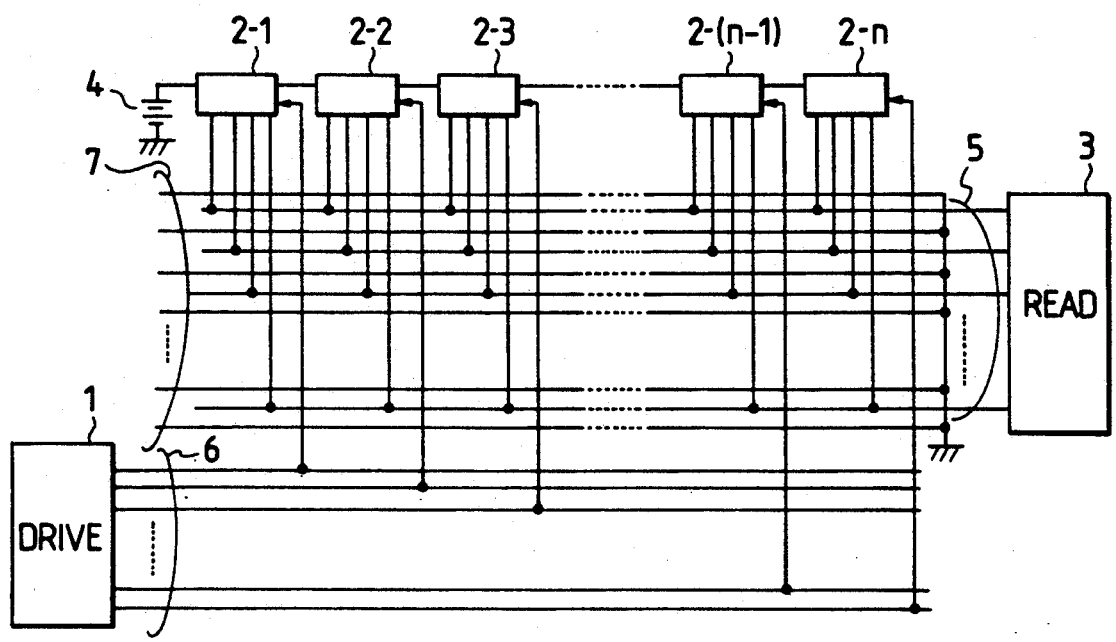
FIG. 1 is a block diagram showing a basic arrangement of a conventional photoelectric conversion device.
Figure 2:
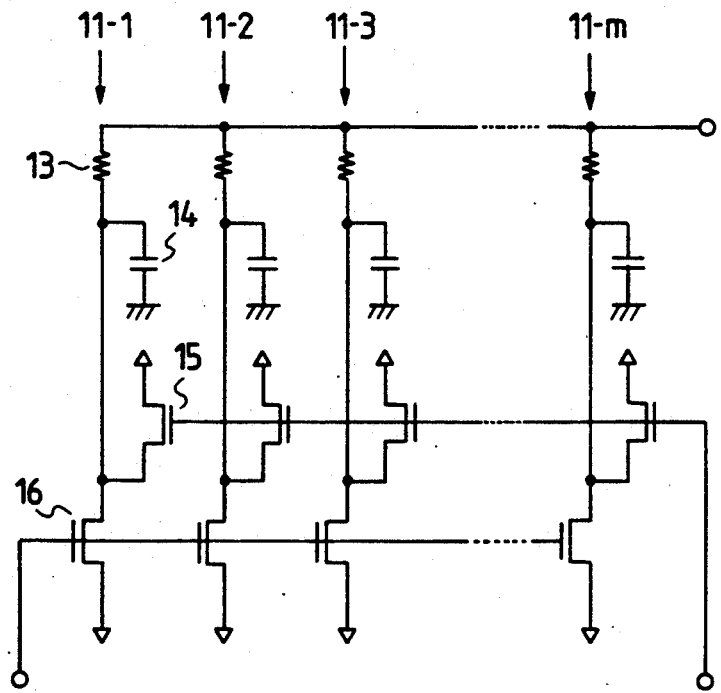
FIG. 2 is a circuit diagram showing one of the blocks of the conventional photoelectric conversion device.
Figure 3:
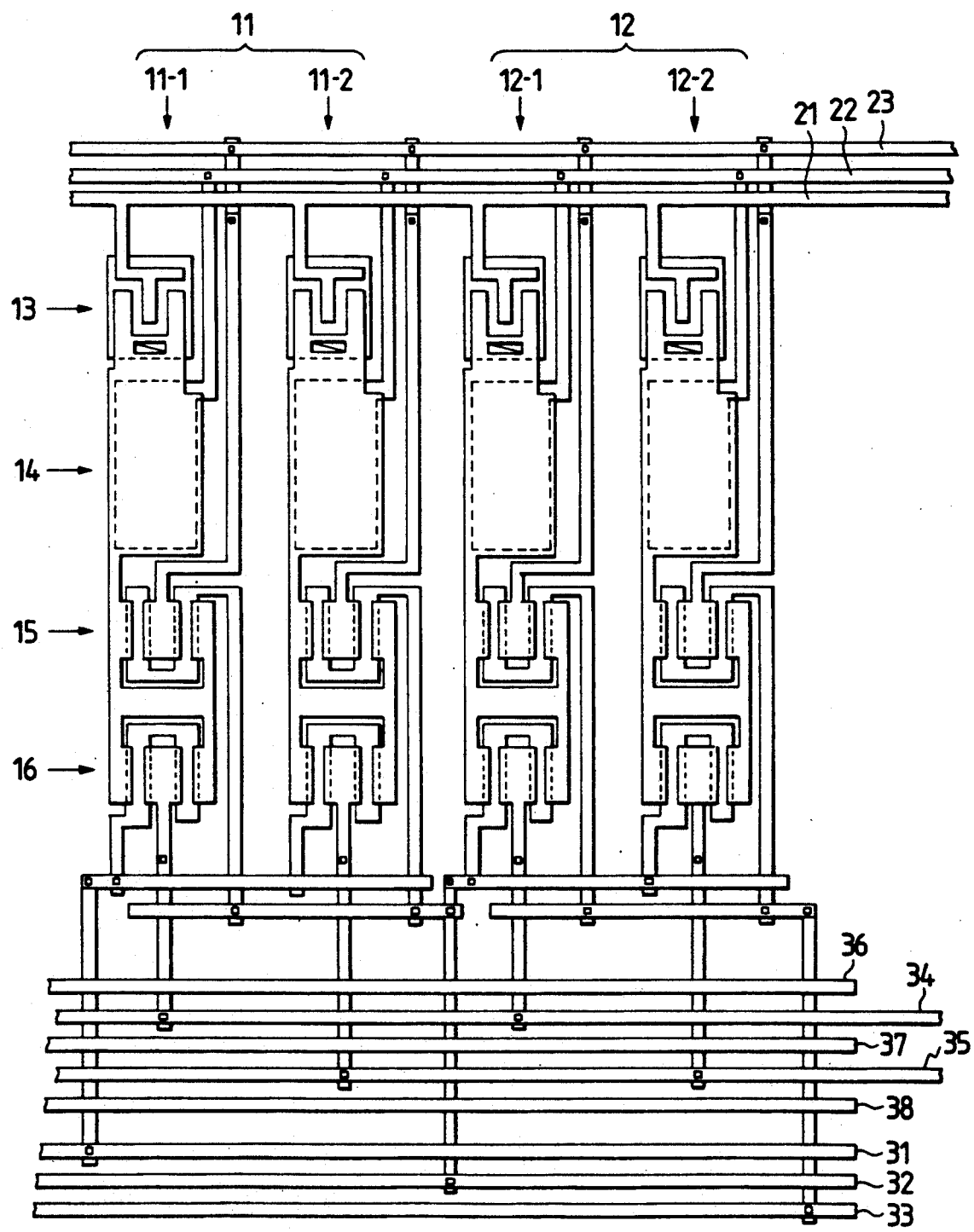
FIG. 3 is a view showing a wiring pattern of a detailed arrangement of the conventional photoelectric conversion device.
Figure 4:
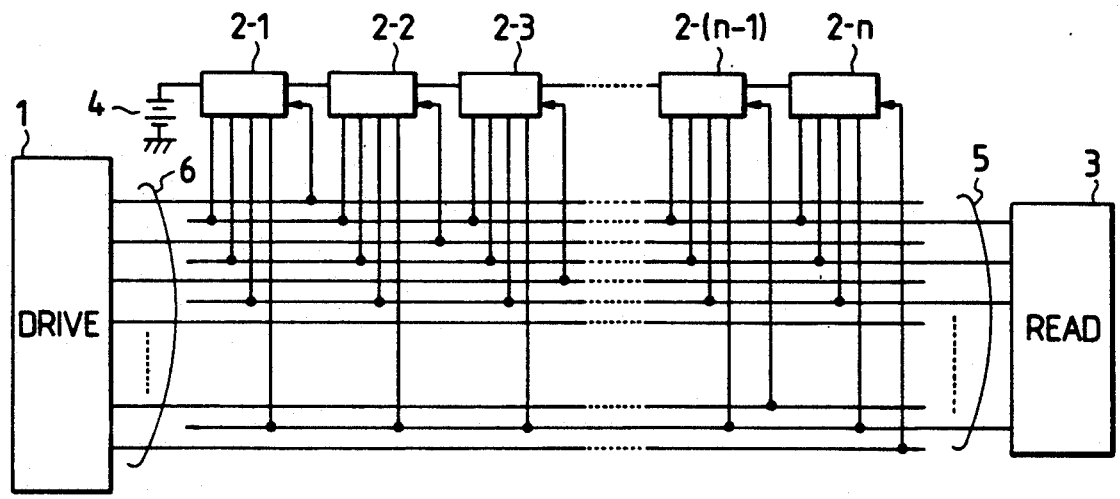
FIG. 4 is a block diagram showing a basic arrangement of a photoelectric conversion device according to an embodiment of the present invention.

FIG. 4 is a block diagram showing a basic arrangement of a photoelectric conversion device according to an embodiment of the present invention.

Referring to FIG. 4, the photoelectric conversion device comprises n blocks 2-1 to 2-n constituting a sensor section. Each block comprises m sensor elements each consisting of a combination of a photoelectric conversion section, a charge storage section, and a switch section. In this embodiment, the number of bits of the photoelectric conversion device is n×m in all (n, m are positive integer). A voltage supply source 4 applies a voltage commonly to the photoelectric conversion sections of all the blocks provided at an image reading apparatus body or a photoelectric conversion device. A drive circuit IC 1 sequentially drives the blocks. The drive circuit 1 controls the switch sections to simultaneously read charges from the charge storage sections upon application of the common voltage to the photoelectric conversion sections. Wiring lines 6 formed by Al thin film patterned connect the drive circuit 1 to switch sections of each block. A read circuit IC 3 extracts a common output from the photoelectric conversion sections corresponding to each block. Wiring lines 5 connect the switch sections of each block to the read circuit 3.

Figure 5:
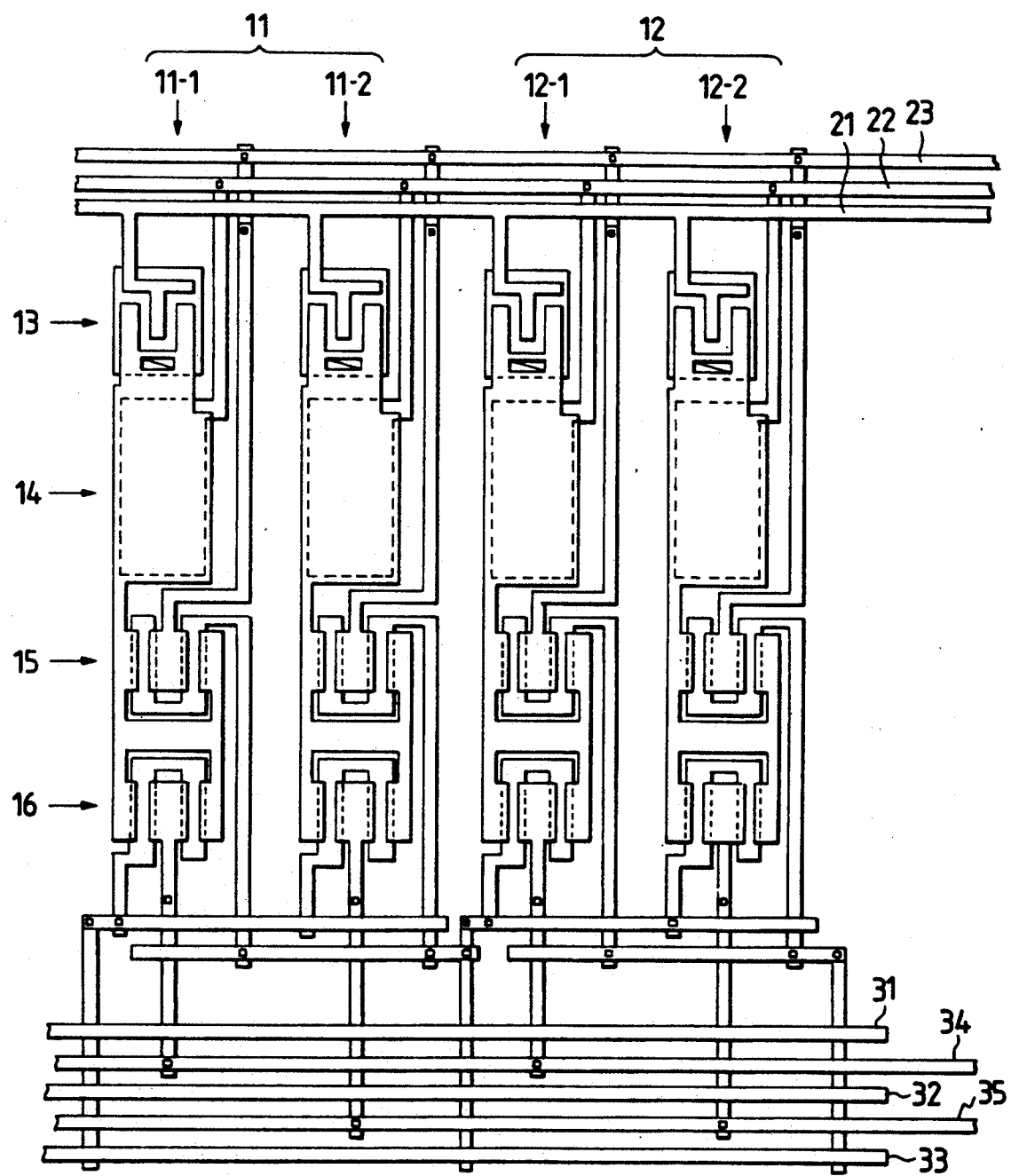
FIG. 5 is a view showing a wiring pattern of a detailed arrangement of the embodiment shown in FIG. 4.

FIG. 5 is a view showing a wiring pattern of a detailed arrangement of this embodiment. The photoelectric conversion device comprises, for example, two blocks, as shown, each consisting of two sensor elements. Only upper and lower wiring patterns and contact holes indicated by a small square are illustrated in FIG. 5.

Referring to FIG. 5, the photoelectric conversion device comprises photoelectric conversion sections 13 each formed by using a semiconductor thin film, for example, a photoconductive layer of amorphous silicon or the like, charge storage sections 14 comprising capacitors. 15 and 16 denote respectively a reset switch section and signal transfer switch section comprising a thin film transistor using thin film semiconductor, in particular, as nonsingle crystalline material, polycrystalline or amorphous silicon or the like. These reset switch and transfer switch have the same structure. A combination of the photoelectric conversion section 13, the charge storage section 14, the reset switch section 15, and the transfer switch section 16 constitutes one sensor element. In this embodiment, the photoelectric conversion device comprises sensor elements 11-1, 11-2, 12-1, and 12-2. The sensor elements 11-1 and 11-2 constitute a first block 11, and the sensor elements 12-1 and 12-2 constitute a second block 12.

A wiring line 21 connects a voltage supply source 4 to one electrode of each of the photoelectric conversion sections 13 of all the blocks. A wiring line 22 is connected to one electrode of each of the charge storage sections 14 of all the blocks and is grounded. A discharge wiring line 23 is connected to the reset switch sections 15 of all the blocks.

The gate lines of the transfer switch sections 16 of the two sensor elements 11-1 and 11-2 in the block 11 are commonly connected to a wiring line 31, and the gate lines of the reset switch sections 15 of the two sensor elements 11-1 and 11-2 are commonly connected to a wiring line 32. Similarly, the gate lines of the transfer switch sections 16 of the two sensor elements 12-1 and 12-2 in the block 12 are commonly connected to the wiring line 32, and the gate lines of the reset switch sections 15 of the two sensor elements 12-1 and 12-2 are commonly connected to a wiring line 33.

The read line from the transfer switch section 16 of the sensor element 11-1 in the block 11 and the read line from the transfer switch section 16 of the sensor element 12-1 in the block 12 are commonly connected to a wiring line 34. Similarly, the read line from the transfer switch section 16 of the sensor element 11-2 in the block 11 and the read line from the transfer switch section 16 of the sensor element 12-2 in the block 12 are commonly connected to a wiring line 35, thereby constituting a wiring matrix.

Figure 6:
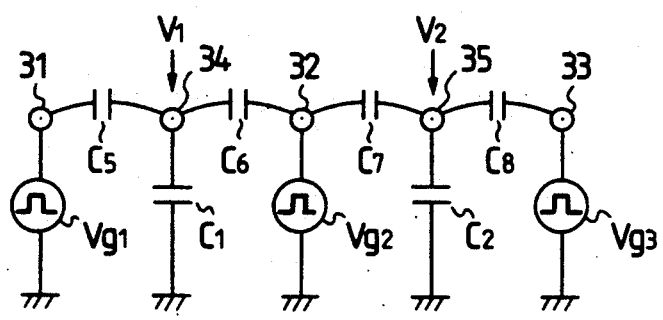
FIG. 6 is a view showing a state of capacitive coupling between adjacent lines of the common gate wiring lines and the common read lines in the embodiment shown in FIG. 4.

FIG. 6 is a view showing capacitive coupling between adjacent lines of the common gate wiring lines and the common read wiring lines in this embodiment.

Referring to FIG. 6, the common gate or read wiring lines shown in FIG. 5 are given as common gate or read wiring lines 31 to 35. These common lines are capacitively coupled to each other through line capacitances C5, C6, C7, and C8. The wiring lines 34 and 35 have capacitances C1 and C2 with reference to ground to detect signals. Signal voltages applied to the wiring lines 31, 32, and 33 are defined as Vg1, Vg2, and Vg3, and voltages appearing on the wiring lines 34 and 35 are defined as V1 and V2.

Figure 7:
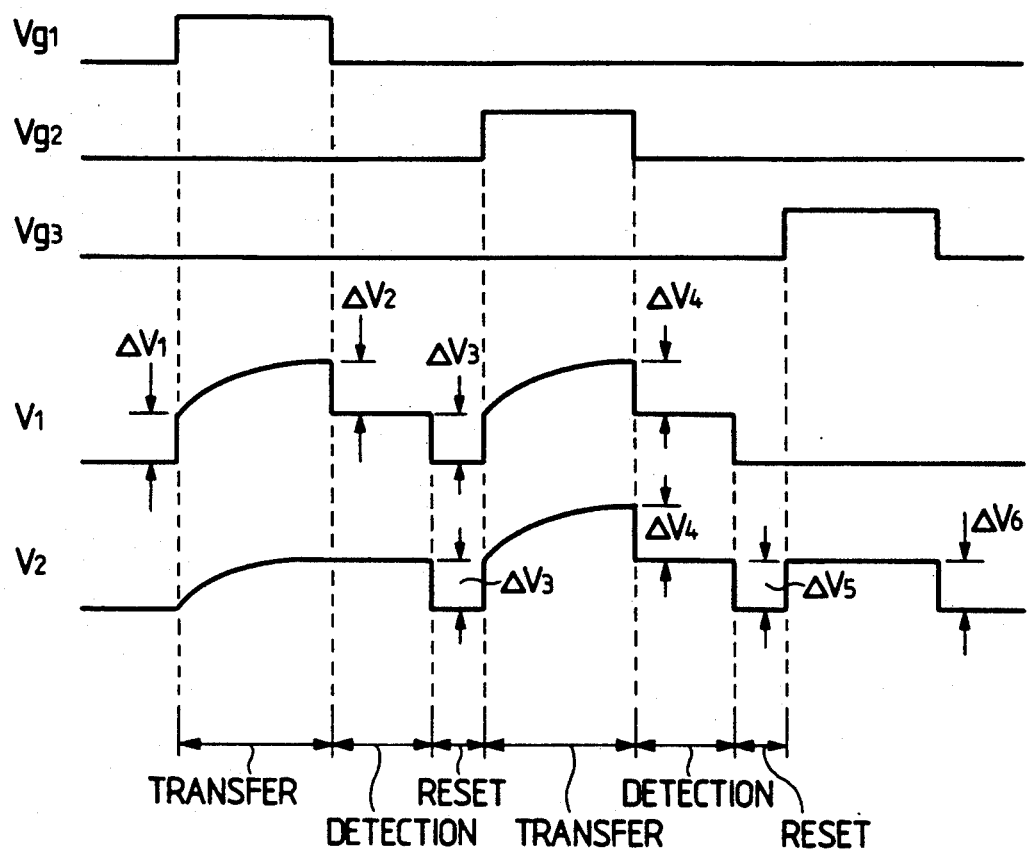
FIG. 7 is a timing chart for explaining the operation of the embodiment shown in FIG. 4.

FIG. 7 is a timing chart for explaining the operation of this embodiment.

When the common gate wiring line 31 is set at high level, the voltage V1 of the common read wiring line 34 is abruptly changed by the line capacitance C5. A change V1 in this voltage is determined by the amplitude of a gate voltage and the capacitances C5 and C1. A charge stored in the charge storage section 14 is output onto the common read wiring line 34 when the transfer switch section 16 of the sensor element 11-1 in the first block 11 is turned on. The voltage V1 is kept constant at a level corresponding to the signal charge.

When the common gate wiring line 31 is set at low level, the voltage V2 is abruptly changed by the line capacitance C5. A change $\Delta V2$ in this voltage is determined by the amplitude of the gate voltage and the capacitances C5 and C1. The change $\Delta V2$ is almost equal to the change $\Delta V1$. Therefore, at the end of charge transfer, an influence caused by an abrupt change in voltage V1 during detection of the transfer charge is almost negligible in practice.

Meanwhile, the common read wiring line 35 is not capacitively coupled with the common gate wiring line 31 because the voltage of the common gate wiring line 32 is kept constant. There are no abrupt changes corresponding to the changes $\Delta V1$ and $\Delta V2$. A charge stored in the charge storage section 14 is output onto the common read wiring line 35 when the transfer switch section 16 of the sensor element 11-2 in the first block 11 is turned on. The voltage V2 is kept constant at a level corresponding to the signal charge.

When the charge transfer period elapses as described above, the signals are read by the read circuit 3.

When the common gate wiring line 32 is set at high level, the voltage V1 of the common read wiring line 34 and the voltage V2 of the common read wiring line 35 are abruptly changed by the line capacitances C6 and C7. A change $\Delta V3$ in these voltages is determined by the amplitudes of the gate voltages and the capacitances C6, C7, C1, and C2. Charges stored in the charge storage sections 14 are output onto the common read wiring lines 34 and 35 when the transfer switch sections 16 of the two sensor elements 12-1 and 12-2 in the second block 12 are turned on. The voltages V1 and V2 are kept constant at levels corresponding to the signal charges.

When the common gate wiring line 32 is set at low level, the voltages V1 and V2 of the common read wiring lines 34 and 35 are abruptly changed by the line capacitances C6 and C7. A change $\Delta V4$ in these voltages is determined by the amplitudes of the gate voltages and the capacitances C6, C7, C1, and C2. The change $\Delta V4$ is almost equal to the change $\Delta V3$. Therefore, at the end of charge transfer, an influence caused by abrupt changes in voltages V1 and V2 during detection of the transfer charges is almost negligible in practice.

When the charge transfer period elapses as described above, the signals are read by the read circuit 3.

When the common gate wiring line 32 is set at high level, charges left in the charge storage sections 14 are output from the discharge wiring line 23 when the reset switch sections 15 of the two sensor elements 11-1 and 11-2 of the first block 11 are turned on, thus completing resetting of the photoelectric conversion device.

When the common gate wiring line 33 is set at high level, the voltage V2 of the common read wiring line 35 is abruptly changed by the line capacitance C8. A change $\Delta V5$ in this voltage is determined by the amplitude of the gate voltage and the capacitances C8 and C2. The change $\Delta V6$ is almost equal to the change $\Delta V5$.

Meanwhile, the common read wiring line 34 is not capacitively coupled with the common gate wiring line 33 because the voltage of the common gate wiring line 32 is kept constant. Therefore, there are no abrupt changes corresponding to the changes $\Delta V5$ and $\Delta V6$.

When the common gate wiring line 33 is set at high level, charges left in the charge storage sections 14 are output from the discharge wiring line 23 when the reset switch sections 15 of the two sensor elements 12-1 and 12-2 in the second block 12 are turned on, thereby completing resetting of the photoelectric conversion device.

As described above, even if the common gate wiring lines are arranged between the common read wiring lines constituting the wiring matrix, signal read access is not adversely affected. In addition, the voltage of the common gate wiring line is set at high or low level, i.e., a binary value. The wiring lines are set at a predetermined voltage except for the change between the high and low levels. The voltage of the common gate wiring line is changed at a timing except for the read operation. As described above, since the common gate wiring lines are arranged between the common read lines, this arrangement is equivalent to an arrangement of the shield wiring lines in the conventional device. Capacitive coupling between the common read wiring lines can be eliminated, and crosstalk can be reduced.

The photoelectric conversion device as described in the above constitutes, for example, an image reading apparatus as a unit structure wherein:

photoelectric conversion section 13 as a charge storage type photosensor elements, signal charge storage section 14, a reset switch 15 as switch elements, a transfer switch 16, wirings 21, 22, 23, and multi-layer matrix wiring section comprising drive signal lines 31, 32, 33 and read signal lines 43, 35 are formed on a common substrate by semiconductor thin-film process;

a semiconductor integrated circuit for driving, a semiconductor integrated circuit for reading, and corresponding wirings on the substrate are connected by wire bonding or the like and are arranged on a common support; and an illumination means is provided within the unit structure. The unit is mounted on an image reading apparatus. The apparatus controls the operation of the photoelectric conversion device. The concrete structure of the photoelectric conversion device is described in detail as follows.

Figure 8:
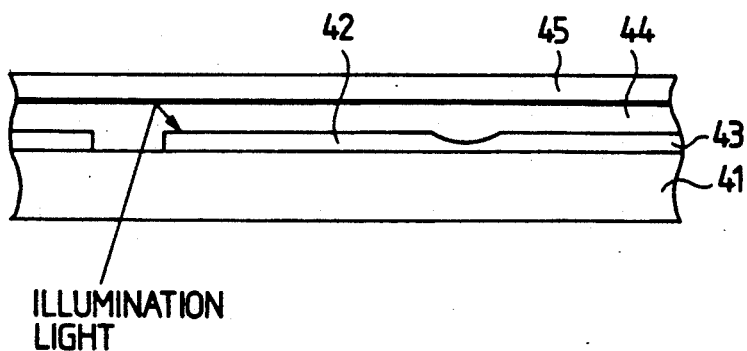
FIG. 8 is a partial sectional view showing a state of use of the photoelectric conversion device shown in FIG. 4.

FIG. 8 is a partial sectional view showing a state of use of the photoelectric conversion device of this embodiment.

Referring to FIG. 8, a sensor section 42 and a matrix wiring section 43 are formed on a transparent substrate 41 of glass or the like. The sensor section 42 comprises a plurality of blocks each having a plurality of sensor elements each consisting of the photoelectric conversion section, the charge storage section connected to the photoelectric conversion section, and the switch section arranged in a path for reading out a charge from the charge storage section. A transparent protective layer 44 is formed to cover the sensor section 42 and the matrix wiring section 43. An original 45 to be read is placed on the protective layer in contact therewith.

Illumination light radiated from a light emission array as an illumination means provided below passes through the substrate 41, a window formed in the sensor section 42, and the protective layer 44, and reaches the original 45. Light reflected by the original 45 reaches the photoelectric conversion section of the sensor section 42, thereby reading the original image.

This embodiment exemplifies a contact type photoelectric conversion device requiring 1/1 magnification lens array and capable of contacting an original.

Figure 9:
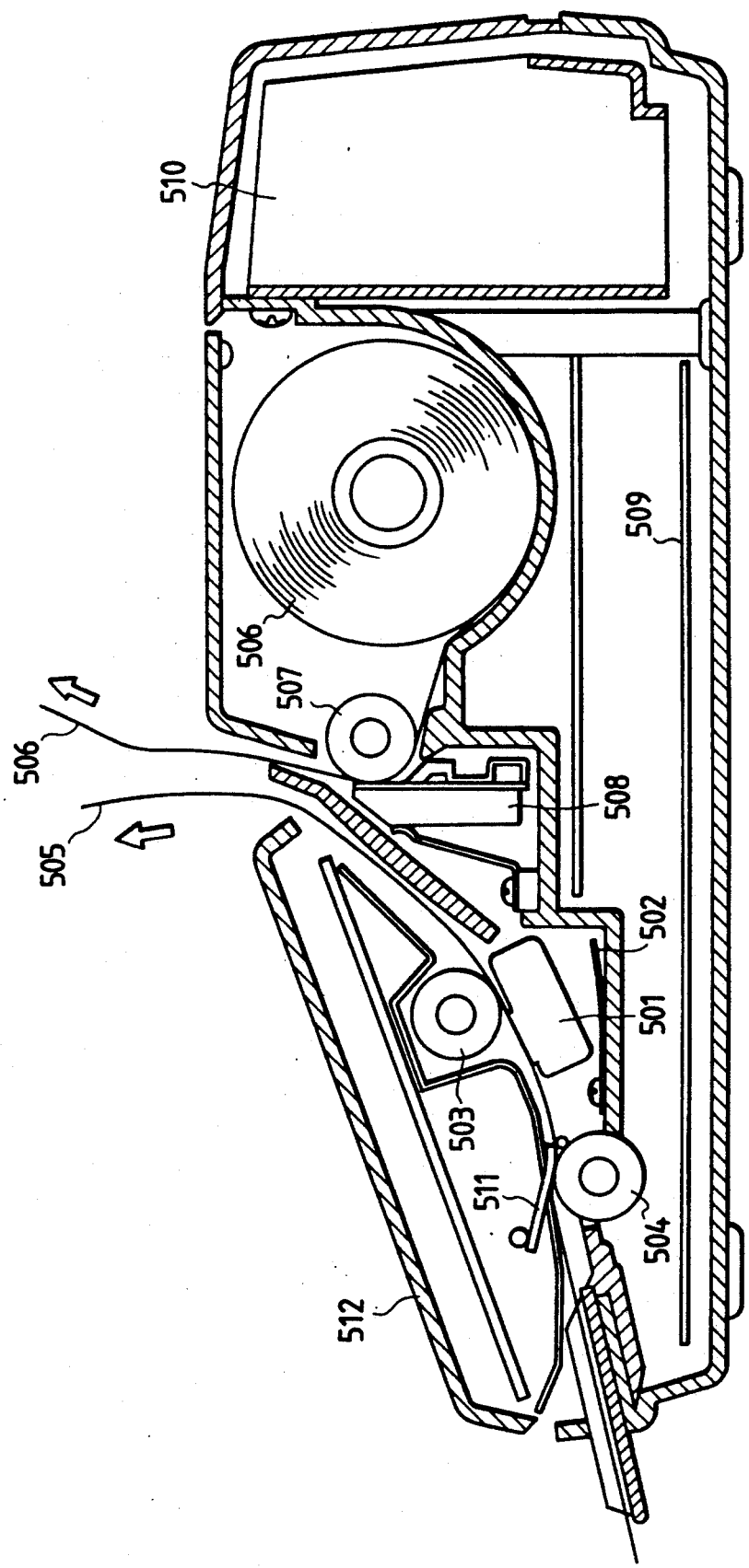
FIG. 9 is a schematic view showing a facsimile apparatus using the photoelectric conversion device shown in FIG. 4.

FIG. 9 is a schematic view showing a facsimile apparatus using the photoelectric conversion device of this embodiment.

In the transmission mode, an original 505 to be read is fed between a feed roller 504 and a separation member 511 and between a photoelectric conversion device 501 and a platen roller 503 in a direction indicated by an arrow. The original 505 is irradiated with light from a light source 502, and light reflected by the original 505 is incident on the photoelectric conversion device 501 to read the original image. An electrical signal from the photoelectric conversion device 501 is then transmitted.

In the reception mode, recording paper 506 is fed between a recording platen roller 507 and a thermal head 508 as a recording means in a direction indicated by an arrow, and an image corresponding to the received signal is recorded on the recording paper 506 by the thermal head 508. As the recording means, another unit such as an ink jet recording head emitting an ink for recording by a thermal energy may be desirably used.

The facsimile apparatus is controlled by a system control board 509, and the respective drive systems and the respective circuits are powered by a power source 510. The facsimile apparatus includes an operation panel 512.

According to this embodiment, as has been described in detail above, since the common gate wiring lines are arranged between the common read wiring lines, the common gate wiring lines can also serve as shield wiring lines. Therefore, crosstalk between the common read wiring lines can be prevented, the width of the wiring section can be reduced without degrading the signal read precision, and compact, low-cost photoelectric conversion devices can be manufactured at a high yield.

What is claimed is:

1. A photoelectric conversion device comprising a plurality of blocks each having a plurality of sensor elements each consisting of a combination of a photoelectric conversion section, a charge storage section connected to said photoelectric conversion section, and a switch section arranged in a path for reading a charge from said charge storage section, wherein gate lines for operating a plurality of switch sections in a given block are commonly connected, and read lines from said switch sections are commonly connected in units of sensor elements corresponding to each block to constitute a wiring matrix, and said gate lines are arranged between the adjacent common read lines of said wiring matrix.

2. A photoelectric conversion device comprising charge storage type photosensor elements of, at least, n×m, and switch elements electrically connected to each of said n×m photosensor elements, characterized by drive signal lines of n commonly connected per m of said switch elements, for transmitting signals driving the m of said switch elements; and read signal lines of m commonly connected per n of said photosensor elements for transmitting photoelectric conversion signal of said m of photosensor elements;

wherein, between said m of read signal lines, said drive signal lines are provided.

3. A photoelectric conversion device according to claim 2, wherein
said drive signal lines are connected to a drive circuit.

4. A photoelectric conversion device according to claim 2, wherein
said read signal lines are connected to a read circuit.

5. A photoelectric conversion device according to claim 2, wherein
said photosensor elements include a photoelectric conversion section and a signal charge storage section.

6. A photoelectric conversion device according to claim 2, wherein
said switch elements transmit the photoelectric conversion signal of said photosensor elements.

7. A photoelectric conversion device according to claim 2, wherein
said switch elements reset voltages of said photosensor elements at a desired levels.

8. A photoelectric conversion device according to claim 2, wherein
said photosensor elements, said switch elements, said drive signal lines, and said read signal lines are formed on a common substrate.

9. A photoelectric conversion device according to claim 2, wherein
said sensor elements have a photoelectric conversion layer of amorphous material.

10. A photoelectric conversion device according to claim 2, wherein
said switch elements have a semiconductor layer of amorphous material.

11. A photoelectric conversion device according to claim 2, wherein
said photosensor elements have a photoelectric conversion layer of amorphous silicon.

12. A photoelectric conversion device according to claim 2, wherein
said switch elements have a semiconductor layer of amorphous silicon.

13. A photoelectric conversion device according to claim 2, wherein
said drive signal is a binary signal having high and low levels.

14. A photoelectric conversion device according to claim 2, further comprising
illumination means for illuminating an original carrying image information to be read by said photoelectric conversion device.

15. An image reading apparatus comprising:
a photoelectric conversion device according to claim 14; and
a control circuit for controlling a device of said photoelectric conversion device.

16. An image reading apparatus according to claim 15, further comprising recording means.

17. An image reading apparatus according to claim 16, wherein
said recording means is an ink jet head for emitting an ink by thermal energy.

* * * * *